United States Patent

[11] 3,602,822

[72] Inventors Wayne Wheeler Evans; Jerome Benjamin Bean Jr. both of Indianapolis, Ind.

[21] Appl. No. 829,057
[22] Filed May 29, 1969
[45] Patented Aug. 31, 1971
[73] Assignee RCA Corporation

[54] TELEVISION ELECTRONIC CONTROL CIRCUIT FOR CHANNEL SELECTIONS
14 Claims, 5 Drawing Figs.

[52] U.S. Cl. .......... 325/464, 325/470, 325/456, 334/18
[51] Int. Cl. .......... H04b 1/16
[50] Field of Search .......... 178/5.8 R; 334/8–10, 17–21; 325/390, 392, 395, 456, 452, 458, 459, 462, 464, 465, 470, 471

[56] References Cited

UNITED STATES PATENTS

| | | | |
|---|---|---|---|
| 2,812,486 | 11/1957 | Foster .......... | 318/467 |
| 3,478,270 | 11/1969 | Mayle et al. .......... | 325/470 |
| 3,497,813 | 2/1970 | Gallagher .......... | 325/456 |
| 3,518,586 | 6/1970 | Nilssen .......... | 334/7 |

*Primary Examiner*—Robert L. Richardson
*Attorney*—H. Christofferson

ABSTRACT: An electronically controlled tuner for a television receiver is automatically tuned from one to another of preselected channels. A control circuit for channel selection is adapted to energize a plurality of tuner control terminals and channel identification terminals each corresponding to a particular channel. The control circuit is actuatable to automatically change the tuning of the receiver to a selected channel and includes a counter which is energized by an oscillator. Means are responsive to successive counts produced by the counter to apply a control signal to a different one of said tuner control and channel identification terminals for causing said receiver to be tuned from channel to channel in succession with each channel being identified. The means are responsive to counts corresponding to channels within the preselected group for disabling the oscillator each time the counter reaches one of the counts.

TELEVISION ELECTRONIC CONTROL CIRCUIT FOR CHANNEL SELECTIONS

BACKGROUND OF THE INVENTION

It is well known that, in order to change channels in a television receiver, the tuning of the RF stage and the frequency of the local oscillator must be changed. Concurrently with the change of channels it is desirable to display the number of the channel to which the receiver is tuned.

Prior art television tuners have been mechanical. To change channels, the viewer, either directly or by means of remote control, turns a shaft available at the front of the instrument. The shaft may be connected to either different taps on a tuning coil or may act to engage different coils for each channel. In either event, known prior art receivers require mechanical motion to select viewing channels and to switch from one channel to the next. In addition, the channel indicator is energized mechanically by means of devices such as a rotary switch supplying power to light bulbs or by the rotation of a disk indicator.

Mechanical tuning though satisfactory and operational produces many problems. First, mechanical tuning is slow. Secondly, this type of tuning is noisy. Thirdly, mechanical tuning employs mechanical parts which wear and deteriorate with time. Also, when mechanical tuning is coupled to the remote selection of channels, motors are required to advance from one channel to the next which makes this section of the apparatus expensive.

It is an object of this invention to provide a television receiver in which the channels are electronically selected without moving parts.

It is another object of this invention to provide automatic selection of preselected channels.

It is a further object of this invention to provide a receiver in which channel selection is relatively fast, which is not noisy when tuned, which involves little or no mechanical parts, and which may be inexpensively produced.

SUMMARY OF THE INVENTION

An electronically controlled tuner for tuning a television receiver to any one of a group, which may be less than all, of the channels of the receiver. A sequencer automatically tunes the tuner from channel-to-channel, in succession. Means responsive to the tuning of said tuner to any one of said preselected channels, inactivates the sequencing means.

11. The combination as claimed in claim 10 wherein said receiver includes an on-off switch, and further including:

means responsive to the throwing of said switch to the off position for causing said tuner to remain tuned to the channel to which it was tuned immediately prior to the time said switch is thrown to the off position.

Figure 5:
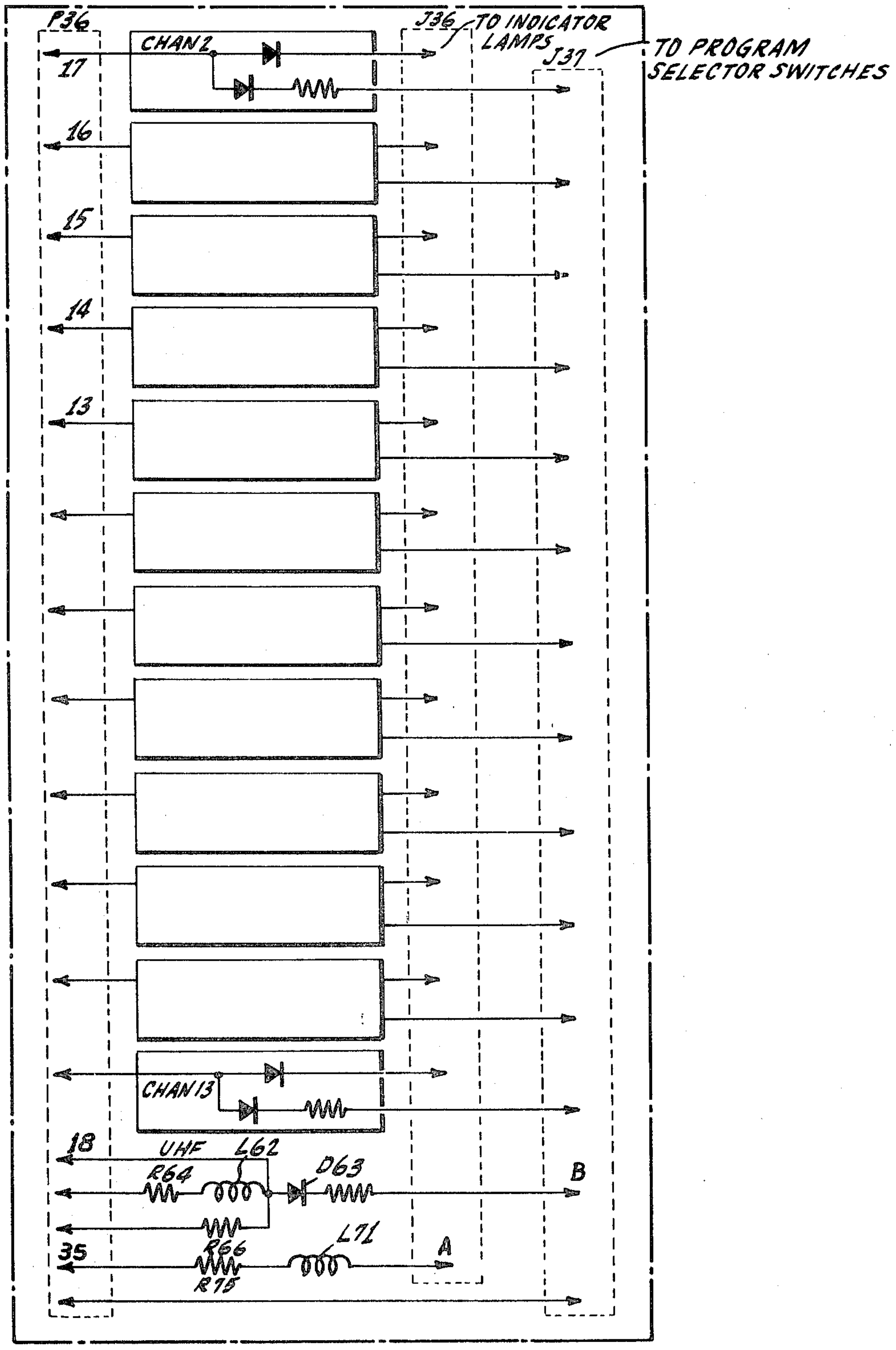

FIG. 5 is a diagram showing the diode network coupling the output of the driver stages to the channel indicator lamps and to the program selector switches.

DETAILED DESCRIPTION

Figure 1:
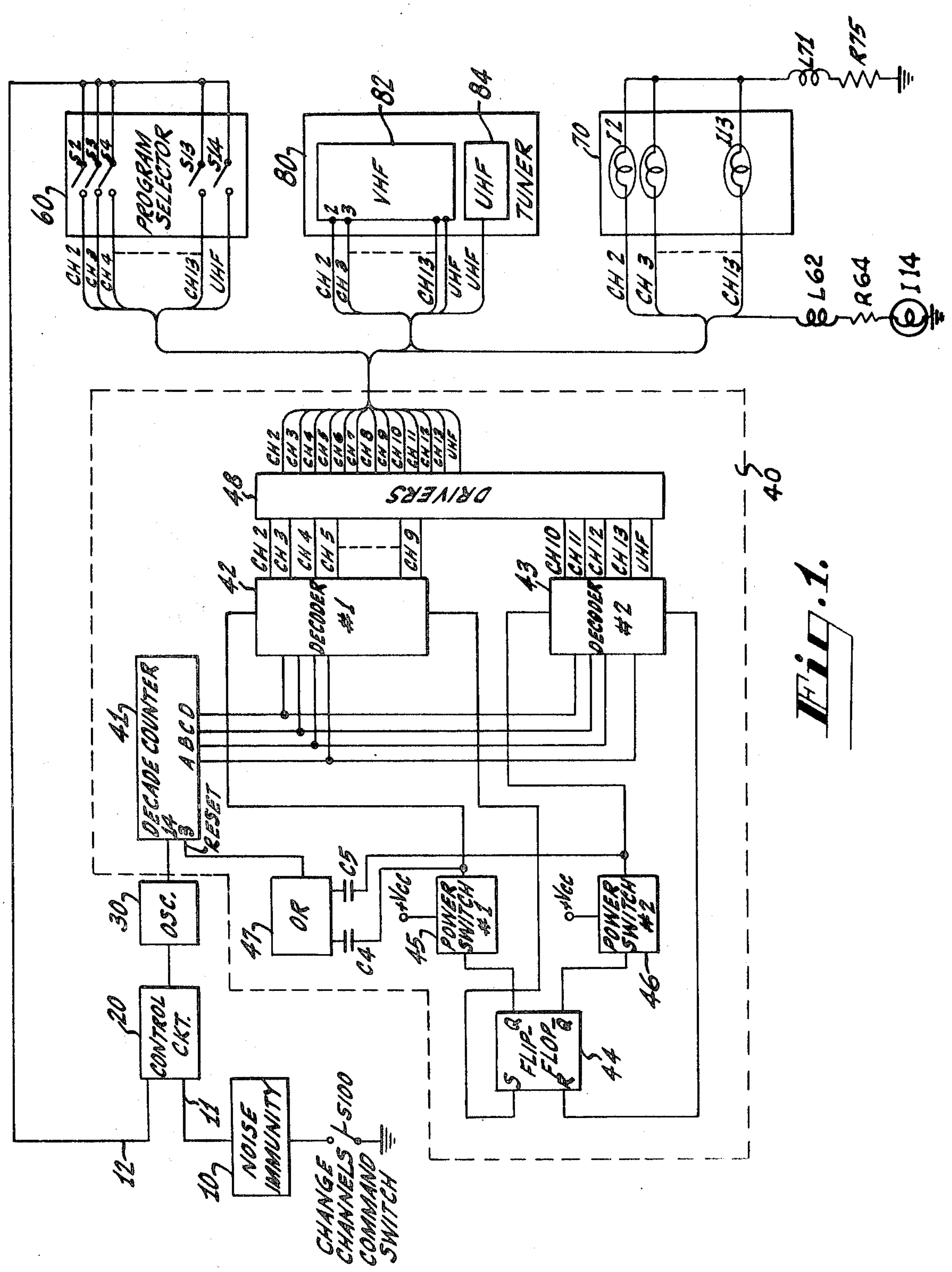
FIG. 1 is a block diagram of one embodiment of the invention wherein sequencing means drive a television tuner.

In the system of FIG. 1, the tuner 80 and in conjunction therewith the bank of indicator lamps 70 and the bank of program selector switches 60 are electronically controlled. Each signal applied to a channel of the tuner is also applied to the indicator lamp corresponding to that channel and to the program selector switch corresponding to that channel.

The tuner section 80 shown in FIG. 1 includes a VHF section 82 and a UHF section 84. The VHF tuner has 13 terminals, each corresponding to a different one of the channels from 2 to 13 and UHF. In the preferred embodiment, the VHF tuner has 12 tuned circuits (not shown) each of which is coupled to a different one of the 12 VHF terminals. The UHF position switches the VHF tuner into a UHF I.F. amplifier mode. It should be noted that the VHF tuner could, for example, also comprise a single circuit which could be tuned to different frequencies by means of different voltage levels applied to the various terminals. In the preferred embodiment however, each of the 12 tuned circuits is individually and separately selected when a signal of sufficient amplitude is applied to its tuner terminal. Since a potential applied to one of the terminals causes the video information of the channel coupled thereto to be displayed, it is clear that only one terminal may receive such a potential at any one time.

The UHF tuner 84 is treated for the purpose of this application as another channel and may be selected like any of the VHF channels. However, as there are a great many stations in the UHF region, in the particular embodiment chosen for illustration, UHF station selection is achieved by means of an additional continuous control (not shown) which tunes the receiver to those UHF stations in conventional fashion. It is to be understood of course, that the UHF tuner can instead be treated like the VHF tuner, that is, it may have a plurality of input terminals, each corresponding to a different UHF station, and tuned electronically in the same manner as the VHF channels, as discussed below.

Corresponding to each channel there is a program selection switch. These switches (S2 through S14) are closed in advance by the viewer, for example when the set is first installed or even just before sitting down to view several television programs on different channels, to the channels he desires automatically to be selected and displayed. These switches, when closed, provide a path for a feedback signal which stops the receiver at the preselected channels.

Corresponding to each channel there is also an indicator lamp. These indicator lamps (I2 through I14) are lit whenever the corresponding channel is displayed.

The tuner 80, the program selector switches 60 and the bank of indicator lamps 70 are operated in parallel, but it should be obvious that they could also have been operated in series, or partly in series and partly in parallel the only criteria for the mode of operation being reliability and ease of connection and assembly.

In the operation of the system in response to a viewer generated command to change channels, the receiver passes the channels not of interest, without displaying them, and stops only when it reaches the next preselected channel. The means for accomplishing this includes a sequencing means comprising the oscillator 30 and the associated counting circuits, and which in response to the change channel command sequentially energizes, one at a time, a tuner terminal and the corresponding channel coupled thereto. When a channel which has been preselected is reached, that is, when a pulse is applied to the tuner terminal for a channel whose program selector switch is closed, a feedback signal is produced which prevents the sequencing means from advancing to the next channel, so that the preselected channel is displayed.

The change-channel switch S100, which is activated by the viewer whenever he wants to change channels, is connected to a noise immunity and pulse shaping circuit 10. The noise immunity circuit removes the effects of contact bounce generated by the switch closure and in response to a switch closure of given duration provides a single relatively smooth "-start oscillation" pulse on line 11 which is fed to control section 20. The control section 20, when energized by the "start oscillation" pulse, allows pulses from oscillator 30 to be fed to a decade counter represented by block 41. Once enabled, the oscillator supplies pulses to counter 41 until a feedback pulse is applied to line 12 inhibiting the further application of pulses to the counter.

The decade counter is part of the counting means 40 whose function is to provide, in response to pulses from the oscillator, output signals which are capable of sequentially energizing the channels of the tuner 80 as well as the corresponding lines connected to the program selector switches 60 and to the bank of indicator lamps 70.

Figure 3:
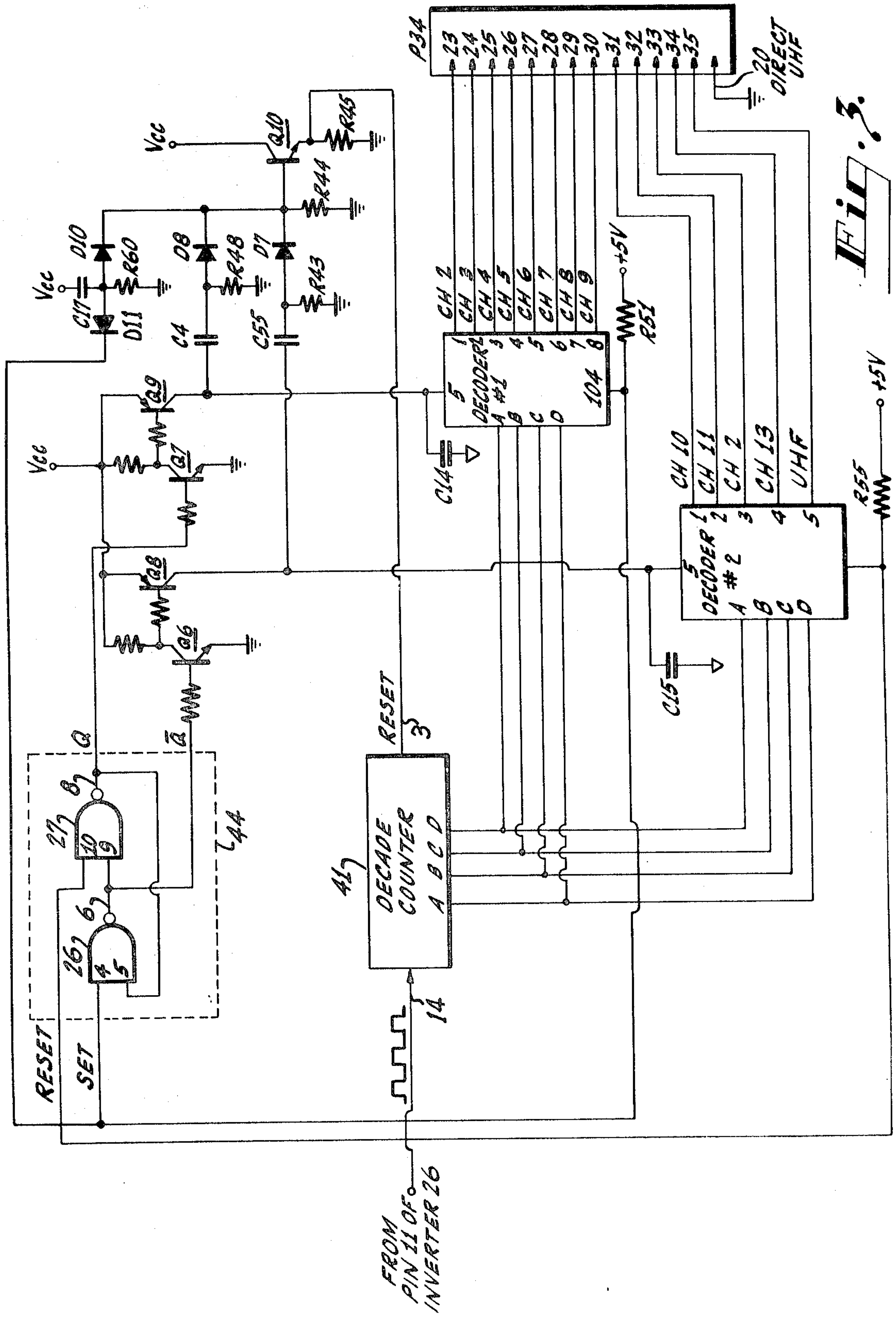
FIG. 3 is a schematic diagram of the counter and decoders contained in the sequencing means.

The counting means therefore may be a shift register, a ring counter or other means suitable for generating pulses in a sequential order. However, to minimize components and power and to use presently available integrated circuits the combination shown in FIG. 1 and further detailed in FIG. 3 is used. The counter 41 is wired to provide 10 counts (0–9) in binary coded decimal (BCD) format. The counter has four outputs denoted by the letters A, B, C, and D having, respectively, the weights of 1, 2, 4, and 8. The counter is automatically reset after the tenth count or by a pulse from the output of "OR" gate 47. The counter's four outputs are fed in parallel by decoder 1, represented by block 42, and decoder 2, represented by block 43. Decoders 1 and 2 are well known binary-coded-decimal to decimal converters (BCD to decimal decoders). Each decoder has 10 outputs and each decoder output uniquely represents one count of the 10 counts.

It should be noted that each decoder is returned by means of a power switch to the $V_{CC}$ line. Thus, decoder 1 is coupled to $+V_{CC}$ by power switch 1 represented by block 45 and decoder 2 is coupled to $V_{CC}$ by power switch 2 represented by block 46. Power switch 1 receives the Q output of flip-flop 44 and power switch 2 receives the complementary output $\overline{Q}$ of the flip-flop 44. The decoder 42 connects to the set terminal S of the flip-flop and decoder 43 connects to the reset terminal R of the flip-flop. The power switches 1 and 2 are AC coupled by capacitors C4 and C5 to "OR" gate 47. This ensures that every time power switch 1 or power switch 2 is energized, a reset pulse is fed to the counter, resetting the latter to its zero count.

The operation of the counting means is best understood by first assuming that the set-reset flip-flop 44 is reset (i.e., Q is "high" and $\overline{Q}$ is "low") so that power switch 1 is turned on and power switch 2 is not energized. Under these conditions, decoder 1 has power applied thereto while decoder 2 has no power applied thereto.

Pulses applied to counter 41 cause signal to appear on lines A, B, C, and D, which are decoded by decoder 1 and appear as sequentially spaced pulses on its output lines. (Note that only eight decoded outputs are needed to produce the control signals for channels two through nine.) In other words the eight counts (0000, 0001–0111), produced in response to the reset pulse (which produces count 0000) and seven pulse following the reset pulse correspond to the decoder outputs for channels two through nine respectively. Note that when decoder 1 decodes the ninth count (1000) from the counter, it responds to the eighth input pulse following the reset pulse. It sets the flip-flop forcing Q to go low and $\overline{Q}$ to go high. This, in turn, removes power from decoder 1 and applies power to decoder 2. Simultaneously, in response to $\overline{Q}$ going high, a reset pulse is fed to the decade counter via OR gate 47, resetting the latter. The counter output is now decoded by decoder 2 which is also capable of providing 10 output pulses. (Note that when the counter is reset and decoder 2 is energized, the initial position of the counter corresponds uniquely to the decoded output for channel 10). Since only five of the 10 outputs from decoder 2 are necessary to energize the remaining five tuner channels, the flip-flop is reset after the fifth count out of decoder 2.

By using alternately gated power switches to apply power to the two decoders, it is possible to obtain 2N decoded outputs from a counter arranged to have N counts, where N is an integer greater than 1. The decoder outputs operated at a $+V_{CC}$ level which is typically 5 volts are coupled through inverter and power driver stages represented by block 48 which level shifts the signals to $+V_{DD}$ level which is typically 30 volts. There are 13 driver stages and each output of a driver stage drives a channel of the tuner, and corresponding to that channel an indicator lamp and a program selector switch.

The automatic selection process provided by the system may now be explained by an example in which it will be assumed that the viewer wishes to see only channel 2 or channel 13. Switch S2 and switch S13, corresponding to channels 2 and 13 respectively are closed, and the remaining switches are kept open. It will be further assumed that prior to depressing switch S100, power is present and channel 2 is being displayed. Activating switch S100 causes the control section to enable the oscillator, which supplies pulses to the counter. After the first pulse, the counter, which was at the counter position corresponding to channel 2, advances by one count. This generates a pulse at the output marked channel 3 of the decoder 1. Since power has been removed from the line corresponding to channel 2, indicator light I2 goes off. Channel 3 is momentarily energized. However, as its program selector switch S3 is open, no signal is fed back to the control section. Therefore, the oscillator continues to operate, and its next output pulse causes the counter to advance by one. The pulse is removed from the channel 3 terminal of the decoder 42 and the new count causes a pulse to be applied at its channel 4 terminal.

As the duration of the pulse applied to the channel 3 terminal is short, and as an inductive network is connected in series with the lamps to slow their response, the indicator light for channel 3 does not light up with sufficient intensity or for a sufficient length of time to be visible to the viewer. As for the audio and video signals of the momentarily energized circuits, a muting circuit, described later, prevents audio and video display while the oscillator is enabled.

The oscillator continues to provide pulses to the counter which are decoded by decoder 1 until channel 9 is reached and which are then decoded by decoder 2 until channel 12 is reached. The next pulse causes the channel 13 terminal to be energized. As the corresponding selector switch S13 is closed, a feedback pulse is applied via line 12 to the control circuit 20. This pulse disables the oscillator and prevents the further application of pulses to the counter. The counter is thus stopped at the count corresponding to the decoded output which is fed to the channel 13 line. The tuned circuit corresponding to channel 13 is turned on, indicator lamp I13 corresponding to channel 13 is on and remains on so long as S100 is not again activated.

The system thus presents the means for electronically and automatically selecting preselected channels requiring no moving parts.

Figure 2:
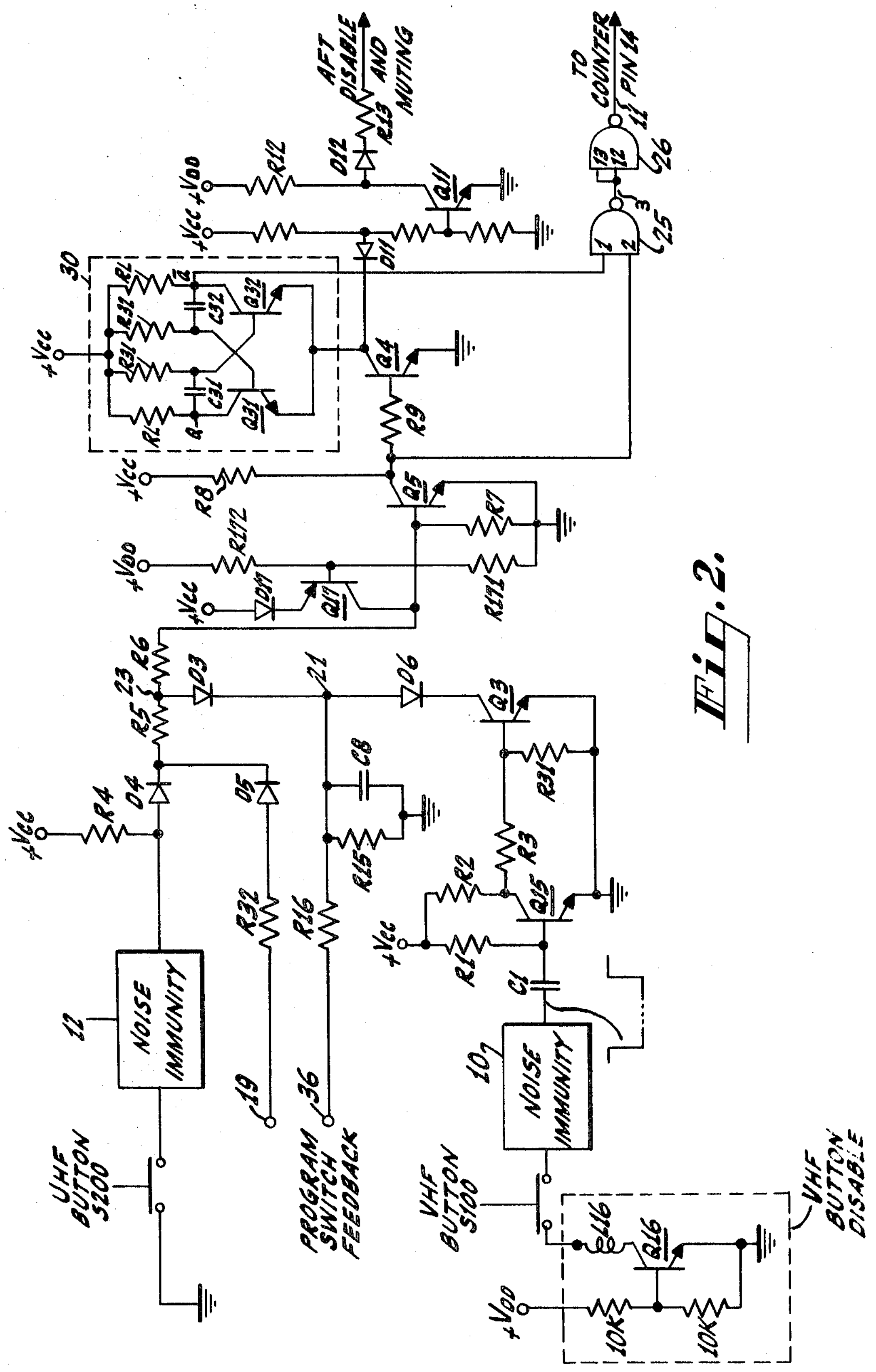
FIG. 2 is a schematic diagram of the control and oscillator circuits of the sequencing means.

The detailed operation of the system is best understood by referring to FIG. 2 which shows a detailed schematic of the oscillator and control circuits and to FIG. 3 which shows a detailed schematic of the counter and associated circuits.

The counting and sequencing cycle is initiated by the closure of either VHF button S100 or UHF button S200. These switch closures result in lowering the bias on the base of transistor Q5 which results in the enabling of the oscillator and the feeding of pulses to the counter. The counting cycle is stopped or inhibited when there is a signal feedback to terminal 36 via a program switch and either (a) there is a positive signal present at terminal 19 or (b) current is permitted to be conducted from $V_{CC}$ through resistor R4 and diode D4. In either case *a* or *b* (when terminal 36 is energized), the bias on the base of transistor Q5 is raised sufficiently to saturate the latter and lower its collector potential to approximately zero volts.

The base of grounded emitter transistor Q5 is connected to the junction point of resistors R7 and R6. The other terminal of resistor R7 is connected to ground while the other terminal of resistor R6 is connected to junction point 23. Junction point 23 is connected to one terminal of resistor R5 and to the anode of diode D3. The other terminal of resistor R5 is connected to the cathodes of diodes D4 and D5. The anode of diode D4 is connected through resistor R4 to $+V_{CC}$ and to the output side of a noise immunity circuit 120 whose input is connected to UHF button S200. The anode of diode D5 is connected through resistor R32 to terminal 19.

The cathode of diode D3 is connected to junction point 21 to which are connected two current paths. The first path includes resistor R16 connected between terminals 36 and 21 and resistor R15 and capacitor C8 connected between junction point 21 and ground. The second path includes diode D6 having its anode connected to junction point 21 and its cathode to the collector of ground emitter transistor Q3. The base of transistor Q3 is connected to the junction of resistors R3 and R31, the latter having its other end grounded. Resistor R3 has its other side connected to the junction of the collector of transistor Q15 and resistor R2 which is connected to $+V_{CC}$. The base of grounded emitter transistor Q15 is connected to the junction of capacitor C1 and resistor R1, the other end of R1 being connected to $+V_{CC}$ and the other end of C1 being connected to the output of noise immunity circuit 10. The input of noise immunity circuit 10 is connected to one side of VHF button S100. The other side of S100 is connected to ground through an inductor L16 in series with the collector to emitter path of transistor Q16. The base of transistor Q16 is connected through two 10 kilohm resistors to $+V_{DD}$ which is the tuner potential. $+V_{DD}$ is generated by the receiver only when the set is turned on, thus so long as $+V_{DD}$ is not present, the VHF button cannot produce a grounding signal, thus preventing any change in channel until the receiver is fully powered.

Closing S100 applies a grounding signal to the noise immunity circuit 10. Switch closures normally have multiple closures due to contact bounce which results in a high noise level and a multiplicity of pulses applied to the input line. Therefore, a noise immunity circuit, which may be any of a well-known number of digital or analog circuits, is used to provide a single well defined output pulse or step in response to a switch closure. The output of the noise immunity circuit 10 is a negative going pulse and is applied to one side of capacitor C1. The negative going leading edge of the pulse produced by the noise immunity circuit is AC coupled to the base of transistor Q15 and causes the voltage at the base of Q15 to go negative with respect to ground. The negative voltage on the base of Q15 turns this transistor off until resistor R1 recharges capacitor C1 to the point that the potential at the base of Q15 reaches a level equal to or greater than the base to emitter junction voltage ($V_{BE}$) of Q15. Transistor Q15 will therefore be cut off for a period of time identified as $T_1$ following a closure of the S100 switch.

Turning transistor Q15 off allows current to flow through resistor R2 and resistor R3 into the base of grounded emitter transistor Q3 driving it into saturation. When Q3 saturates, capacitor C8 is discharged through the low impedance shunt path of forward biased diode D6 and the saturation resistance ($R_{SAT}$) of the collector-to-emitter path of Q3. In addition, the voltage at junction point 23 is decreased to a value equal to the forward voltage drop ($V_F$) of diodes D3 and D6 in series with the collector-to-emitter saturation voltage $(V_{CE})_{SAT}$ of Q3.

Before transistor Q3 turns on, grounded emitter transistor Q5 is saturated by means of the conduction path comprising resistor R4, diode D4, resistor R5, and resistor R6. When Q3 turns on, the current at junction point 23 is shunted as mentioned above by the series combination of D3 and D6 and $R_{SAT}$ of Q3. Since the $V_F$ of the diodes is at most 0.8 volts and the voltage across $R_{SAT}$ is typically not more than 0.2 volts, the voltage at junction point 23 is lowered sufficiently so that the voltage at the base of transistor Q5 is brought below the threshold voltage ($V_{BE}$) of that transistor by the additional current and voltage divider action of resistors R6 and R7. Q5 is thus initially turned off for a period $T_1$ and its collector which is returned to $+V_{CC}$ volts through R8 rises towards $+V_{CC}$ volts. Following the period $T_1$, transistor Q3 is again cut off, but note that Q5 is still maintained in the cutoff region due to the combination of D3 and R15 shunting junction point 23 to ground. Thus, so long as a positive potential is not fed back to terminal 19 (the next channel is "programmed out"), Q5 will be cut off. If the next channel is "programmed in," Q5 will not be cut off by the loading effects of R15.

As mentioned above, closure of UHF button S200 with VHF button S100 open and Q3 cut off also causes Q5 to cut off and pulses to be fed to the counter. Closing S200 applies a grounding signal through a noise immunity circuit 12 similar to circuit 10 described above. The output of the noise immunity circuit grounds the junction of R4 and D4 shunting to ground the current normally forward biasing transistor Q5. This cuts off Q5 initiating oscillation of the multivibrator circuit 30. Q5 remains cut off until positive going feedback signals from the UHF driver are applied to terminals 19 and 36 forward biasing Q5 and locking the circuit to the UHF channel. Closure of S200 selects the UHF channel and the receiver is locked on to the UHF channel until the VHF button S100 is activated. S100 is the main change channel command switch and can be used to change from any channel to any other channel whereas S200 may be used to directly select only the UHF channel, bypassing all VHF channel positions.

The collector of Q5 is coupled by means of resistor R9 to the base of grounded emitter transistor Q4 and to terminal 2 of two-input NAND gate 25. When Q5 cuts off, the positive potential present at the collector of Q5 drives transistor Q4 into saturation and also applies a positive potential to input number 2 of gate 25. Q4, when saturated, provides a low impedance ground return for the astable multivibrator 30 setting the latter into oscillation and also clamps the cathode of diode D11 thereby lowering the bias on the base of transistor Q11 below the threshold level of the latter. When Q11 cuts off, a signal of $V_{DD}$ volts is fed through the series combination of resistor R12, diode D12 and resistor R13 to circuits used to disable the Automatic Fine Tuning (AFT) and to mute the audio and video thereby preventing any undesirable sound and display during the channel changing period.

Oscillator 30 is a standard astable multivibrator comprising two AC coupled cross coupled inverters. Q31 and Q32 have their collectors (denoted respectively by Q and $\overline{Q}$ to indicate that one side is the complement of the other) connected by resistors $R_L$ to $+V_{CC}$. The collector of Q31 is coupled by C31 to the base of Q32 and the collector of Q32 is coupled to the base of Q31 by C32. The base of Q31 and the base of Q32 are respectively coupled by R31 and R32 to $+V_{CC}$. The emitters of Q31 and Q32 are connected in common to the collector of Q4.

When Q4 saturates, the emitter electrodes of Q31 and Q32 are returned to near ground potential through the saturation resistance of Q4 and the astable multivibrator oscillates at a rate determined primarily by the produce of the two time constant, one being R31, C31, and the other R32, C32.

The $\overline{Q}$ side of the oscillator (it could just as well have been the Q side) is connected to input number 1 of NAND gate 25. Gate 25 has an output 3 which is "low" only when its two inputs are "high." Thus, as long as Q5 was conducting and its collector near ground potential, terminal 2 was effectively grounded maintaining the output of the gate high and thereby inhibiting any oscillator pulses from coming through. However, with Q5 cut off and $+V_{CC}$ applied to terminal 2, the NAND-gate is now controlled by the voltage level present at $\overline{Q}$. When $\overline{Q}$ goes high, the voltage at output 3 goes "low" and when $\overline{Q}$ goes low, the voltage at output 3 goes "high." Output 3 of NAND gate 25 is coupled through inverter 26 to the input of the decade counter.

It should be noted when Q5 gets cut off, it turns Q4 on, but the turnoff of Q5 always occurs a short but definite period of time before Q4 turns on. As a result, no matter which side (Q or $\overline{Q}$) of oscillator 30 first goes to ground, there will be a positive or "high" voltage level present at both inputs of NAND gate 25 for a definite if short period of time. This causes the voltage at output 3 of gate 25 to go from its normally high level to a low voltage level. This level change is inverted by inverter 26 producing at its output 11 a voltage transition going from the normally low level to the high level. Thus, a voltage step going from negative to positive is fed to the counter. Since the counter is of the type which advances one count for each transition at its input which goes from high to low, the counter is advanced to at least the next count in response to either a closure of S100 or S200 and the first "low" appearing on Q32 terminal $\overline{Q}$.

The oscillator will continue supplying pulses to the counter and the latter will continue counting said pulses so long as Q5 remains cut off. However, eventually a preselected channel is energized by a pulse generated from the counter, and a positive potential is fed back onto line 36. The bias on line 36 is applied to junction point 21 through resistor divider R16 and R15. Note that Q3 turns off after a period $T_1$ which is less than the period of a pulse from the oscillator. The voltage at junction point 21 can therefore rise and reverse bias diode D3 (i.e., its cathode goes positive with respect to its anode). This in turn allows current to flow through the "OR" arrangement comprising either R4 and D4 coupled to $+V_{CC}$ or R32 and D5 coupled to terminal 19. The "OR" arrangement is a highly reliable means of inhibiting any further sequencing regardless of whether the sequencing was initiated by S100 or by S200.

The detailed operation of the counter circuit discussed briefly above is best understood by referring to FIG. 3. Following the closure of switches S100 or S200, a pulse going from high to low is applied to the decade counter 41 causing its output to change. The decade counter has four outputs labeled A, B, C, and D. These outputs, given the weight of 1, 2, 4, and 8 respectively, present the output in what is usually referred to as binary coded decimal (BCD) form. (The first pulse is thus represented by 0000 while the second pulse is represented by 0001.) The output thus advances by one count each time a pulse applied to the input of the decade counter makes a transition from the high level to the low level.

The four outputs of the counter are connected to the corresponding four inputs of decoder 1 and decoder 2 which are also marked, A, B, C, and D. Decoders 1 and 2 are of similar construction. Each decoder has 10 outputs and each output is the uncommitted collector of an NPN grounded emitter transistor i.e., there is no pull up resistor between the collector and $+V_{CC}$. Thus, when a decoder output is not energized, a high impedance is presented at that decoder output and when the decoder output is energized there is a very low impedance connecting that decoder output to ground.

Each decoder produces a single switch closure for a given combination of BCD information. Thus, with the decoders alternately enabled and each decoder connected to the counter, 20 pulses sequentially spaced in time and appearing one at a time at each of 20 outputs are available. But, since there are only 13 channels which have to be energized, decoder 1 is arbitrarily chosen to provide 8 decoded outputs each of which is coupled to a different one of the channels from 2 through 9 and decoder 2 is arbitrarily chosen to provide 5 decoded outputs, each of which is coupled to a different one of the channels from 10 through 13 and to the UHF channel.

In addition to the 13 outputs used to drive the tuner, the ninth output of decoder 1 is coupled to the set side of flip-flop 44 and the sixth output of decoder 2 is coupled to the reset side of flip-flop 44. The ninth output of decoder 1 and sixth output of decoder 2, using resistors R51 and R55 respectively, provide a "high" signal to the set and reset terminals until the corresponding outputs are energized.

Decoders 1 and 2 have their power input pin connected to $+V_{CC}$ by means of the collector to emitter path of transistors Q9 and Q8 respectively. The emitters of Q8 and Q9 are connected to $+V_{CC}$ while the base of transistor Q8 is connected to the collector of transistor Q6 and the base of transistor Q9 is connected to the collector of transistor Q7. The combination of transistors Q6 and Q8 and the combination of transistors Q7 and Q9 form two complementary NPN-PNP power switches which were represented in the block diagram by blocks 46 and 45 respectively. The base of transistor Q6 is connected to the $\overline{Q}$ side of flip-flop 44 and the base of transistor Q7 is connected to the Q side of flip-flop 44.

Flip-flop 44 consists of two 2-input NAND gates 26 and 27 which are cross coupled to form a set-reset bistable multivibrator. The set side (terminal 4 of NAND gate 26) is connected to the ninth output of decoder 1 which is connected through resistor R51 to $+V_{CC}$. The reset side of flip-flop 44 (terminal 10 of NAND gate 27) is connected to the sixth output of decoder 2, which is connected through resistor R55 to $+V_{CC}$. Terminal 5 of NAND gate 26 is connected to terminal 8 (Q) of NAND gate 27 and terminal 6 of NAND gate 26 ($\overline{Q}$) is connected to terminal 9 of NAND gate 27.

Assuming Q to be high (and therefore $\overline{Q}$ low) a positive voltage is applied to the base of Q7 turning it on and thereby driving Q9 into saturation. This applies $+V_{CC}$ to pin 5 of decoder 1 while decoder 2 is disconnected from $+V_{CC}$. Eight outputs are arbitrarily taken from decoder 1 and the ninth count is used to apply a grounding signal to the set side (terminal 4 of NAND gate 26) of flip-flop 44. Grounding the set side causes terminal 6 ($\overline{Q}$) of NAND gate 26 and terminal 9 of NAND gate 27 to go high. Since terminal 10 of NAND gate 27 which is connected through resistor R55 to $+V_{CC}$ is also high and the voltage at the Q goes to ground locking the flip-flop in this stable state (i.e., Q ≈ zero volts, $\overline{Q}$ ≈ to $+V_{CC}$).

When $\overline{Q}$ equal to $+V_{CC}$, transistor Q6 will be turned on, in turn driving Q8 into saturation. Q8 now clamps pin 5 of decoder 2 to $+V_{CC}$ while Q9 which is turned off opens the connection between terminal 5 of decoder 1 and $+V_{CC}$. Thus, power has effectively been switched from decoder 1 which is now "unpowered" and whose outputs are now floating to decoder 2 which is now set to decode the outputs of the decade counter. Decoder 2 is selected to decode 5 counts out of the counter and on the sixth count a ground signal is applied to the reset side of flip-flop 44 causing Q to go high and $\overline{Q}$ to go low. This switches power back to decoder 1 and cuts off power to decoder 2.

It should be noted that capacitor C14 connected between terminal 5 of decoder 1 and ground and capacitor C15 connected between terminal 5 of decoder 2 and ground are used to maintain power on the decoders during the transition phase of the power switching.

Having analyzed the operation of the counter and decoders and having shown how sequential output signals are produced in response to pulses from the oscillator, it now remains to be seen how the decade counter is reset. The decade counter is reset every time one of the power switches is energized (i.e., every time Q8 or Q9 goes on) and every time the logic level potential ($+V_{CC}$)) is applied to the system. This, in addition to a reset pulse to flip-flop 44 through diode D11, assures that the decade counter always returns to the first position (channel 2) when the television receiver is first plugged into the powerline.

Terminal 3 of counter 41 is the counter terminal to which a positive signal is applied to reset the counter. It is connected to emitter follower transistor Q10 whose base is coupled to what may be described as a three-input "OR" circuit.

One input comes from diode D10 whose anode is connected to the junction of capacitor C17 and resistor R60. C17 and R60 form a differentiating network which generates a positive pulse into the base of Q10 whenever $V_{CC}$ is applied to the differentiating circuit. This ensures that the system will always be turned to channel 2 when $+V_{CC}$ is first generated in the receiver.

The other two inputs come from diode D7 and D8 which couple into the base of Q10 the positive pulse generated by differentiating networks C4 and R48 and C5 and R43 respectively. C4 is connected between the collector of Q9 and the anode of diode D8 and C5 is connected between the collector Q8 and the anode of diode D7. These networks reset the counter each time power is switched to the decoders. Q10 thus takes the positive spikes applied to its base and generates an in-phase signal of sufficient magnitude to reset the decade counter.

Figure 4:
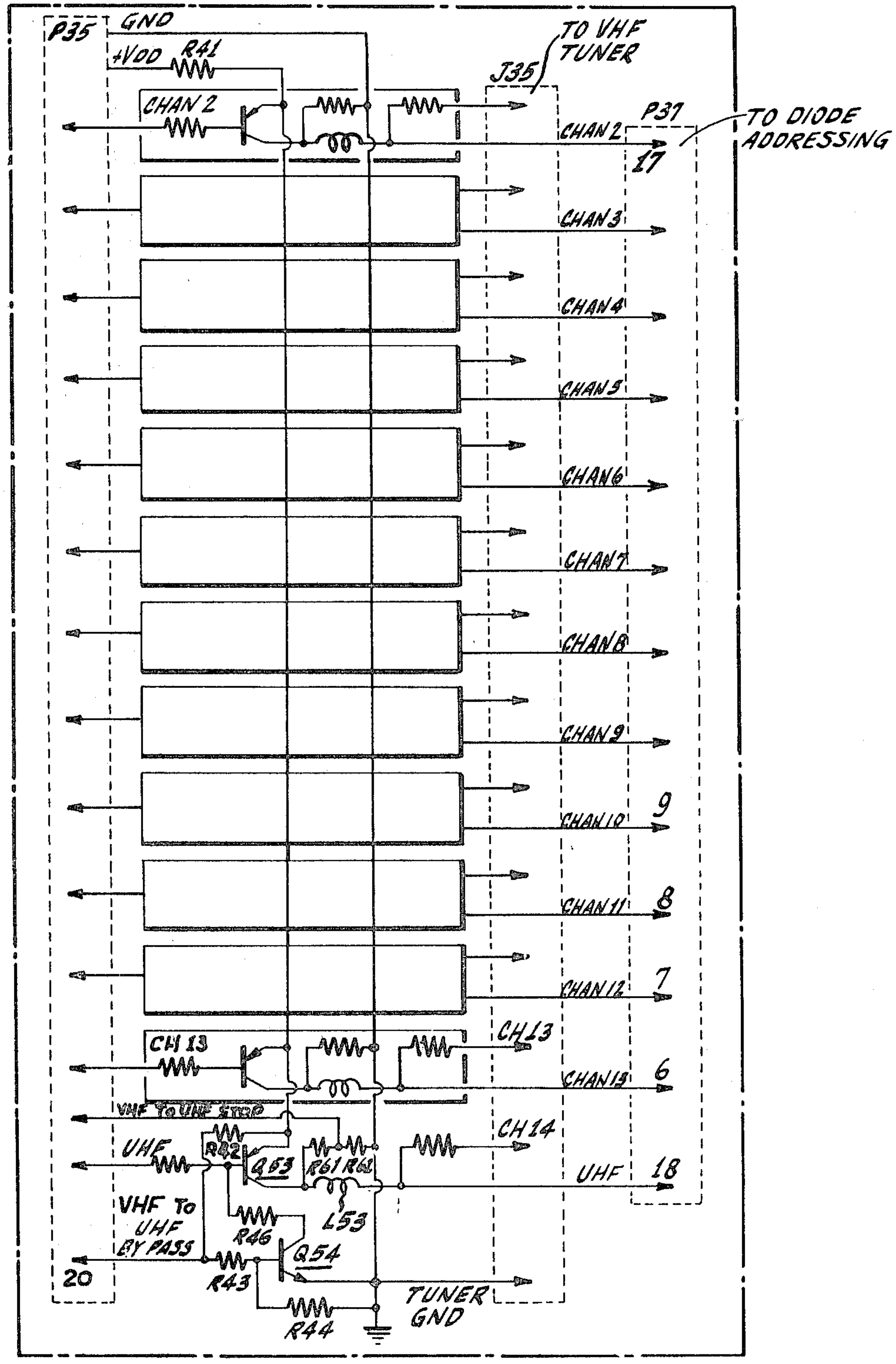
FIG. 4 is a diagram showing the driver stages coupling the decoder outputs to the tuner.

The outputs of the decoders are coupled to the inputs of the drivers shown in FIG. 4. Each decoder output (FIG. 3) is terminated in connector P34 which also has a grounded pin 20. Connector P34 mates with matching connector P35 (FIG. 4) to which the inputs of the drivers are connected. Thus, each driver input is connected to a different one of the decoder outputs. In practice, the drivers are mounted on a board which contains 12 identical circuits for channels 2 through 13 and a thirteenth circuit which, though similar to the others, is modified to provide interlock for the UHF channel. The drivers serve as power amplifiers and inverters and act to level shift the sequencing signals since the tuner is operated at $+V_{DD}$ which is typically 30 volts while the logic circuitry is operated at $+V_{CC}$ which is typically +5 volts. Each of the 12 identical circuits includes a PNP transistor having a base, an emitter, and a collector. The emitters of the driver transistors are connected in common and through a low resistance R41 to the terminal for voltage $+V_{DD}$. The base of each transistor is returned through a current limiting resistor to its corresponding decoder output. Each collector is connected to one terminal of a ground return resistor and to one side of an inductor. The other side of each inductor for channels 2 through 13 feeds in parallel a resistor which couples the driver output to a tuned circuit of the VHF tuner and the anodes of two diodes as shown in FIG. 5. One of the two diodes feeds its indicator lamp circuit and the other diode feeds its respective program selector switch. The inductor in series with each collector serves to prevent any high current spike picked up from the kinescope from causing any damage to the PNP transistor.

A decoder output stage, when energized, provides a path for the base current of the corresponding driver causing the driver transistor to saturate and effectively providing a signal of $+V_{DD}$ amplitude at its collector. Thus, corresponding to a ground signal at one of the decoder outputs, a 30 volt pulse is applied to the corresponding channel line going to the load section.

The UHF channel driver contains more components than the other drivers to enable the UHF channel to be energized if and when any errors in the control, the oscillator or the counter circuit requires the removal of the VHF control board containing that circuit. The UHF driver includes as do the other drivers, a PNP transistor (Q53) having a collector, base, and emitter. The emitter of Q53 is returned in common with the emitters of the other driver transistors. The base of Q53 is also returned as are the other drivers through a resistor to its corresponding UHF decoder output. The collector of UHF driver Q53 is coupled as are the other drivers through a choke to the VHF tuner UHF switching position and in addition as shown in FIG. 5 by means of pin 18 of connector 37 to pin 18 of connector 36 (FIG. 5). The UHF driver is also coupled through diode D63 and pin B of J37 to its corresponding UHF program selector switch S14 shown in block 60 of FIG. 1 and through resistor R66 and pin 35 of connector P36 to the UHF tuner supplying it B+ voltage, and by means of L62 and R64 to the UHF indicator lamp. The collector of Q53 in contrast to the other drivers is connected through two series resistors R61 and R62 to the tuner ground. The junction of the two resistors is connected to terminal 19 which feeds back a positive signal to terminal 19 of the control circuit.

The additional circuitry which turns the UHF driver on when the VHF control board has to be removed, includes NPN transistor Q54 having a base, emitter, and collector. The collector of Q54 is returned through resistor 46 to the base of Q53 while its emitter is connected to ground. The base of transistor Q54 is returned through resistors R43 and R42 to decoupled $+V_{DD}$. The base of Q54 is normally connected to ground by means of the interconnecting pin 20 of plug P35 connected to grounded pin 20 of plug P34. When plug P34 is removed, the base of Q54 is driven positive by means of resistors R52 and R53 which causes transistor Q54 to conduct. Q54 draws base current from Q53 driving the latter into saturation. With Q53 saturated, the UHF channel is energized and will be displayed until plug P34 is again mated to plug P35, at which point Q54 is cut off, its base being close to ground potential.

FIG. 5 shows the method of distributing the signals to the indicator lamp and to the program selector switches. Connector P36 mates with connector P37. The first 12 diode networks are identical, each network comprising two diodes having their anodes connected in common and through the connectors to an inductor which is connected to the collector of each driver transistor.

One of the two diodes from each circuit is used to drive an indicator lamp circuit while the other diode from each circuit is used to drive a program selector switch. The diodes provide isolation between the two circuits. It should be noted that as shown in FIG. 1 all the VHF indicator lamps have one terminal (the one away from the diodes) connected in common through an inductor L71 and a resistor R75 to ground which corresponds to the circuit shown at A of J36 on FIG. 5. The inductor serves to prevent the flow of an initially large current through the "low" cold resistance of the indicator lamps which might damage their filaments. The inductor also serves to slow the rate of rise of current through the lamps thereby preventing flickering of the lamps during the periods when channels are being changed. Because of the physical separation of the VHF channel indicators and the UHF channel indicator, a separate coil L62 and current limiting resistor R64 are provided for the UHF channel indicator lamp.

An additional feature of the tuner control system ensures that whatever channel the receiver is tuned to, when the viewer turns off the television receiver, will be the channel to which the receiver will be tuned when the viewer turns the set on again. The memory feature is achieved by generating the logic potential and maintaining $+V_{CC}$ applied to the decade counter and to the associated logic circuit when the receiver is turned off but still connected to an outlet.

Maintaining power continuously to the logic circuits creates some problems. One of them already alluded to before results from the fact that if the VHF button S100 connection to L16 were connected directly to ground, any actuation of the switch S100 would cause the counter to advance even though the set is turned off. This problem is solved by placing the collector-to-emitter path of Q16 (lower left of FIG. 2) in series with the ground return of switch S100 and connecting the base of Q16 to $+V_{DD}$. Since $+V_{DD}$ is only generated by the receiver when the set is turned on, and since Q16 will be virtually an open circuit so long as $V_{DD}$ is not applied, actuation of the S100 switch before turning on the set will not cause any pulses to be applied to the control circuits.

Another problem arises when the receiver is turned off and $+V_{DD}$ (30 volts) is removed from the driver transistor and thus from the tuner. $+V_{CC}$ (5 volts) remains applied to the counter to preserve the "memory" of the latter. The problem encountered is that the feedback voltage fed from the preselected channel programming switch to terminal 36 of the control board and from there to the network comprising resistors R15 and R16 and C8 is removed. This causes the voltage at junction point 23 to be decreased by means of the shunt path of D3 and R15, as discussed earlier, turning transistor Q5 off. In order to disable the oscillator when the receiver is turned off, a circuit is provided which comprises PNP transistor Q17 having its emitter connected through diode D17 to $+V_{CC}$, it collector connected to the base of transistor Q5, and its base connected to the junction point of resistors R172 and R171 connected between $+V_{DD}$ and ground. So long as $+V_{DD}$ is not applied to the circuit, Q17 is forward biased by means of resistor R171 which provides a conduction path for the base current of Q17. Collector current therefore flows through the collector-to-emitter path of Q17 and into the base of Q5 driving it into saturation. When $+V_{DD}$ is applied to the circuit, R171 and R172 act as a voltage divider developing a potential slightly greater than $+V_{CC}$ which is applied to reverse bias the base of Q17 with respect to its emitter and thereby cutting Q17 off. Thus, when the receiver is turned off, the base of Q5 is coupled to $+V_{CC}$ ensuring that the collector of Q5 is at or near zero potential thereby disabling the oscillator and the NAND gate which enables the pulses to be fed to the counter.

For the purpose of the present discussion it should be understood that the noise immunity circuit may comprise a monostable multivibrator, a Schmitt trigger or a bistable multivibrator coupled to a filter network. These circuits may be used to provide a pulse of given duration after a delay provided by the filter. It should also be clear that an analog circuit such as an RC integrator coupled to an amplifier could also be used to perform this function.

The electronic VHF tuner selected to be used is the digital or diode switched type having tapped coil and switching diode activation: a coil being tapped at a series of points, one for each VHF channel frequency, and a switching diode at each tap. Activation of a given diode shorts out the effect of all coil inductance below the tap point. Activation of a switching diode higher up the coil, relative to the common reference, causes a higher frequency channel to be received while activation of a switching diode lower down the coil causes a lower frequency channel to be received.

What is claimed is:

1. In a television receiver having a tuner, said tuner having a plurality of channels, apparatus for automatically changing the tuning of said tuner to one of a selected in advance group, which may consist of less than all, of said channels comprising, in combination:

sequencing means for electronically tuning said tuner from channel-to-channel, in succession, said sequencing means including means for producing successive control signals; and means responsive to the tuning of said tuner to any one of said preselected channels for inactivating said sequencing means, said inactivating means including feedback means for terminating the production of said successive control signals.

2. The combination as claimed in claim 1, wherein said sequencing means includes signal generating means for producing pulses and counting means responsive to said pulses for producing said control signals.

3. The combination as claimed in claim 2, wherein said signal generating means comprises an oscillator and wherein said counting means includes a pulse counter and decoding means responsive to the counts produced by said counting means.

4. The combination as claimed in claim 3, wherein said oscillator is an astable multivibrator.

5. The combination as claimed in claim 3, wherein said decoding means has a plurality of output terminals, each corresponding to a different channel of said tuner and wherein said counting means includes a plurality of drivers, each connected to a different output terminal of said decoding means and each driver controlling a different one of said channels.

6. The combination as claimed in claim 5, further including a plurality of indicator lamps, each coupled to a different driver, for indicating when the channel for that driver is selected.

7. In a television receiver which includes a plurality of control signal input terminals corresponding to the number of channels in the receiver, and a circuit coupled to said terminals and responsive to a control signal present at a particular one of said terminals for tuning the receiver to the channel to which said terminal corresponds, apparatus for automatically changing the tuning of said receiver to one of a selected group, which may consist of less than all, of said channels comprising, in combination:

a counter;

an oscillator coupled to said counter for supplying the signals to be counted by said counter;

means responsive to successive counts produced by said counter for applying, in response to each count, a control signal to a different one of said terminals, for causing said receiver to be tuned from channel-to-channel, in succession;

means responsive to counts corresponding only to the channels within a selected group for disabling said oscillator each time the counter reaches one of said counts; and means for changing to the next channel within said selected group comprising means for again enabling said oscillator.

8. An arrangement for tuning a television receiver, in sequence, only to certain ones of the channels to which the receiver is capable of being tuned comprising, in combination:

means for sequentially tuning the receiver to each channel to which it is capable of being tuned;

count responsive means coupled to said means for changing the tuning of the said receiver, in succession, from channel-to-channel, in response to a corresponding number of successive counts;

counting means supplying its output to said count responsive means, for producing said successive counts, when energized;

manually settable means coupled to said counting means, responsive to counts indicative of said certain ones of the channels, for stopping said counting means, each time it reaches a count corresponding to one of said certain ones of said channels; and means energizing said counting means and causing it to resume counting, when it is desired to change channels.

9. The combination in a television receiver of:

a television tuner having a plurality of channels;

control means;

means capable of continuously automatically tuning said tuner from channel-to-channel through its entire range of channels, all in response to a single actuation of said control means;

means responsive to the tuning of said tuner to any one of a selected in advance group, greater than one and which may be less than all, of said channels for stopping the tuning of said tuner at said one channel;

said receiver normally connected, by means of a plug, to a source of power; and means responsive to the disconnection and reconnection of said plug from and to said source of power for turning said tuner to a predetermined one of said selected in advance group of channels.

10. The combination in a television receiver of:

a television tuner having a plurality of channels;

control means;

means capable of continuously automatically tuning said tuner from channel-to-channel through its entire range of channels, all in response to a single actuation of said control means, said means for tuning comprising means for electronically tuning, that is, for tuning from channel-to-channel without moving parts; and means responsive to the tuning of said tuner to any one of a selected in advance group, greater than one and which may be less than all, of said channels for stopping the tuning of said tuner at said one channel.

12. The combination in a television receiver of:

a television tuner having a plurality of channels;

manual control means;

means responsive to a single actuation of said control means for automatically tuning said tuner from channel-to-channel, without displaying on said receiver the video information of said channels, said means for tuning including means for electronically tuning, that is, for tuning from channel-to-channel without moving parts; and means responsive to the tuning of said tuner to any one of a selected in advance group, greater than one and which may be less than all, of said channels stopping the tuning of said tuner at said one channel and displaying the video information received on said channel.

13. In a television receiver with a tuner having a plurality of channels, apparatus for automatically changing the tuning of said tuner within a group of channels and visually identifying the selected channel, comprising, in combination:

a first plurality of terminals coupled to said tuner, each terminal of said first plurality of terminals corresponding to one of said plurality of channels of said tuner and operable when energized to cause said tuner to tune to the particular channel to which the terminal corresponds;

indicator means including a second plurality of terminals, each terminal of said second plurality of terminals corresponding to one of said plurality of channels of said tuner and having a member coupled to each of said second plurality of terminals operable when said terminal is energized to provide an illuminated output;

means for selectively energizing said first and said second plurality of terminals, said means for energizing including a plurality of energizable junctions, each junction of said plurality of junctions corresponding to one of said plurality of channels of said tuner; and means connecting said first and said second plurality of terminals with said junctions so that like terminals of said first and said second plurality of terminals which correspond to a particular channel of said tuner are connected to a common junction.

14. The combination as defined in claim 13, wherein said member coupled to each of said second plurality of terminals is an indicator lamp.

UNITED STATES PATENT OFFICE
CERTIFICATE OF CORRECTION

Patent No. 3,602,822 Dated August 31, 1971

Inventor(s) Wayne Wheeler Evans; Jerome Benjamin Bean, Jr.

It is certified that error appears in the above-identified patent and that said Letters Patent are hereby corrected as shown below:

Column 1, line 59, cancel beginning with "11. The combination" to and including "to the off position." in column 1, line 64. Column 9, line 59, that portion reading "resistor 46" should read -- resistor R46 --. Column 12, line 51, after "at said one channel." insert the following claim:

-- 11. The combination as claimed in claim 10, wherein said receiver includes an on-off switch, and further including: means responsive to the throwing of said switch to the off position for causing said tuner to remain tuned to the channel to which it was tuned immediately prior to the time said switch is thrown to the off position. --.

Signed and sealed this 25th day of January 1972.

(SEAL)
Attest:

EDWARD M.FLETCHER,JR.
Attesting Officer

ROBERT GOTTSCHALK
Commissioner of Patents